(12) United States Patent
Rudmann

(10) Patent No.: US 10,903,197 B2
(45) Date of Patent: Jan. 26, 2021

(54) ASSEMBLY OF WAFER STACKS

(71) Applicant: ams Sensors Singapore Pte. Ltd., Singapore (SG)

(72) Inventor: Hartmut Rudmann, Jona (CH)

(73) Assignee: ams Sensors Singapore Pte. Ltd., Singapore (SG)

( * ) Notice: Subject to any disclaimer, the term of this patent is extended or adjusted under 35 U.S.C. 154(b) by 0 days.

(21) Appl. No.: 15/973,714

(22) Filed: May 8, 2018

(65) Prior Publication Data

US 2018/0261585 A1 Sep. 13, 2018

Related U.S. Application Data

(63) Continuation of application No. 15/626,699, filed on Jun. 19, 2017, now Pat. No. 9,997,506, which is a
(Continued)

(51) Int. Cl.
*H01L 27/146* (2006.01)
*H01L 23/544* (2006.01)
(Continued)

(52) U.S. Cl.
CPC ........ *H01L 25/167* (2013.01); *H01L 25/0753* (2013.01); *H01L 25/162* (2013.01);
(Continued)

(58) Field of Classification Search
CPC ............. H01L 23/54426; H01L 23/544; H01L 25/0753; H01L 25/167; H01L 27/14634;
(Continued)

(56) References Cited

U.S. PATENT DOCUMENTS 5,368,683 A 11/1994 Altavela et al.
6,324,010 B1 11/2001 Bowen et al.
(Continued)

FOREIGN PATENT DOCUMENTS

DE 199 08 214 A1 9/2000
EP 1239519 A2 9/2002
(Continued)

OTHER PUBLICATIONS

European Patent Office, Supplementary European Search Report dated Oct. 6, 2015 in corresponding European Application No. 13790259.9.
(Continued)

*Primary Examiner* — Zandra V Smith
*Assistant Examiner* — Abbigale A Boyle
(74) *Attorney, Agent, or Firm* — Michael Best and Friedrich LLP

(57) ABSTRACT

A method of forming a wafer stack includes providing a sub-stack comprising a first wafer and a second wafer. The sub-stack includes a first thermally-curable adhesive at an interface between the upper surface of the first wafer and the lower surface of the second wafer. A third wafer is placed on the upper surface of the second wafer. A second thermally-curable adhesive is present at an interface between the upper surface of the second wafer and the lower surface of the third wafer. Ultra-violet (UV) radiation is provided in a direction of the upper surface of the third wafer to cure a UV-curable adhesive in openings in the second wafer and in contact with portions of the third wafer so as to bond the third wafer to the sub-stack at discrete locations. Subsequently, the third wafer and the sub-stack are heated so to cure the first and second thermally-curable adhesives.

12 Claims, 11 Drawing Sheets

Related U.S. Application Data continuation of application No. 14/401,606, filed as application No. PCT/SG2013/000194 on May 15, 2013, now Pat. No. 9,716,081.

(60) Provisional application No. 61/648,178, filed on May 17, 2012.

(51) Int. Cl.
  *H01L 25/16* (2006.01)
  *H01L 25/075* (2006.01)
  *H01L 33/58* (2010.01)

(52) U.S. Cl.
  CPC .... *H01L 27/1469* (2013.01); *H01L 27/14618* (2013.01); *H01L 27/14625* (2013.01); *H01L 27/14634* (2013.01); *H01L 27/14685* (2013.01); *H01L 33/58* (2013.01); *H01L 23/544* (2013.01); *H01L 2223/54426* (2013.01); *H01L 2224/16225* (2013.01); *H01L 2224/48227* (2013.01); *H01L 2924/12044* (2013.01); *H01L 2924/15311* (2013.01); *H01L 2933/0058* (2013.01)

(58) Field of Classification Search
  CPC .............. H01L 27/14685; H01L 33/58; H01L 2223/54493; H01L 2223/54486; H01L 2223/54268; H01L 2223/5448
  See application file for complete search history.

(56) References Cited

U.S. PATENT DOCUMENTS

| | | | |
|---|---|---|---|
| 6,610,166 B1 | 8/2003 | Harden et al. | |
| 8,405,756 B2 | 3/2013 | Yano et al. | |
| 8,884,347 B2 | 11/2014 | Nihei | |
| 2002/0093104 A1 | 7/2002 | Goldmann et al. | |
| 2003/0147227 A1 | 8/2003 | Egitto et al. | |
| 2005/0024519 A1 | 2/2005 | Nishida et al. | |
| 2007/0126912 A1 | 6/2007 | De Bruin et al. | |
| 2009/0130791 A1 | 5/2009 | Kwon et al. | |
| 2010/0073533 A1 | 3/2010 | Yano et al. | |
| 2010/0073534 A1* | 3/2010 | Yano | B29D 11/00432 348/294 |
| 2010/0073543 A1 | 3/2010 | Takano | |
| 2010/0283113 A1 | 11/2010 | Kang et al. | |
| 2011/0037887 A1 | 2/2011 | Lee et al. | |
| 2011/0043806 A1 | 2/2011 | Guetta et al. | |
| 2011/0080487 A1* | 4/2011 | Venkataraman ... | H04N 5/23232 348/218.1 |
| 2011/0220278 A1 | 9/2011 | Rudmann et al. | |
| 2012/0295665 A1 | 11/2012 | Pantfoerder | |
| 2013/0050677 A1 | 2/2013 | Kwong et al. | |
| 2014/0125849 A1 | 5/2014 | Heimgartner et al. | |

FOREIGN PATENT DOCUMENTS

| | | |
|---|---|---|
| EP | 2 264 898 A1 | 12/2010 |
| JP | S60 149984 A | 8/1985 |
| JP | 07-186395 A | 7/1995 |
| JP | 2000-260933 A | 9/2000 |
| JP | 2001-252618 A | 9/2001 |
| JP | 2002110852 A | 4/2002 |
| JP | 2002290842 A | 10/2002 |
| JP | 2004207644 A | 7/2004 |
| JP | 2005-026587 A | 1/2005 |
| JP | 2005-539276 A | 12/2005 |
| JP | 2009-016534 | 1/2009 |
| JP | 2010-103492 A | 5/2010 |
| JP | 2011113075 A | 6/2011 |
| JP | 2012-009732 A | 1/2012 |
| WO | WO 00/07240 A1 | 2/2000 |
| WO | 2004/027880 | 4/2004 |
| WO | 2008/045968 A2 | 4/2008 |
| WO | WO 2008/045968 | 4/2008 |
| WO | 2010/020062 | 2/2010 |
| WO | WO 2010/020062 | 2/2010 |

OTHER PUBLICATIONS

European Patent Office, International Search Report and Written Opinion dated Oct. 8, 2015 in corresponding PCT Application No. PCT/EP2015/055358.

Office Action issued in Japanese Application No. 2017-102586, dated Mar. 27, 2018, 4 pages (with English translation).

* cited by examiner

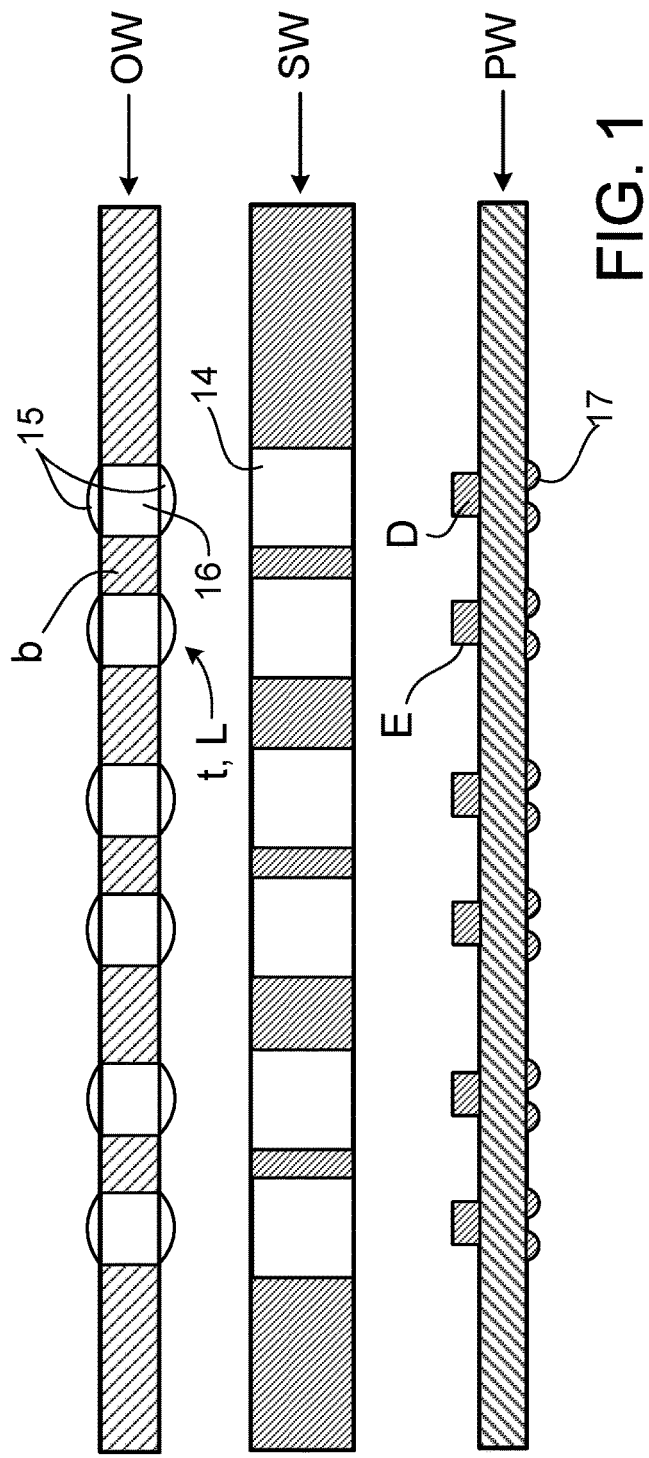
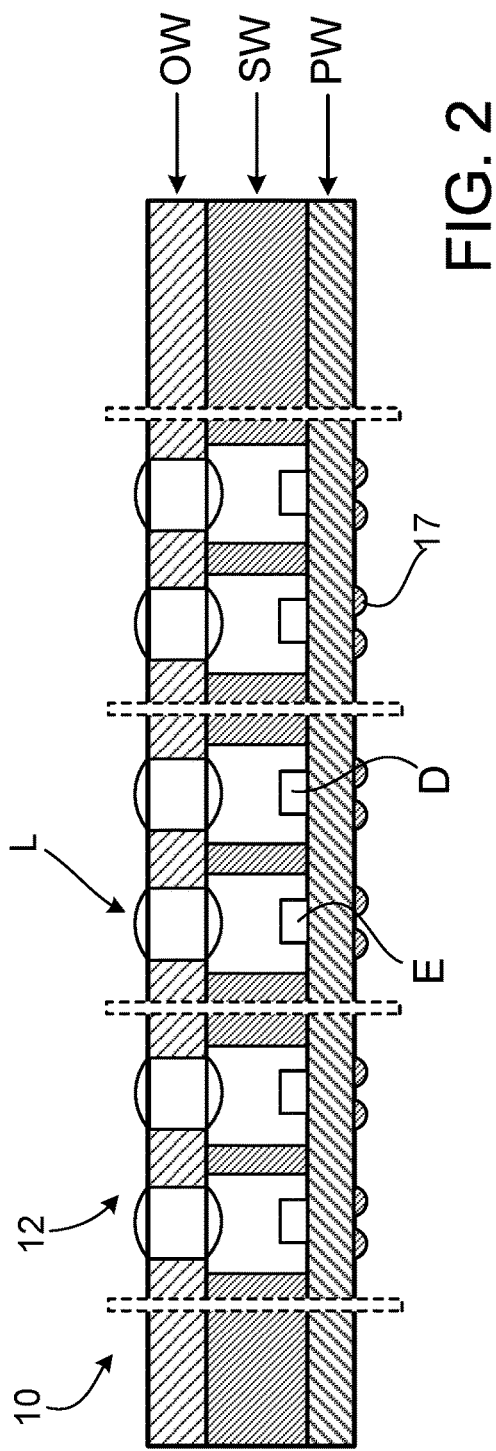

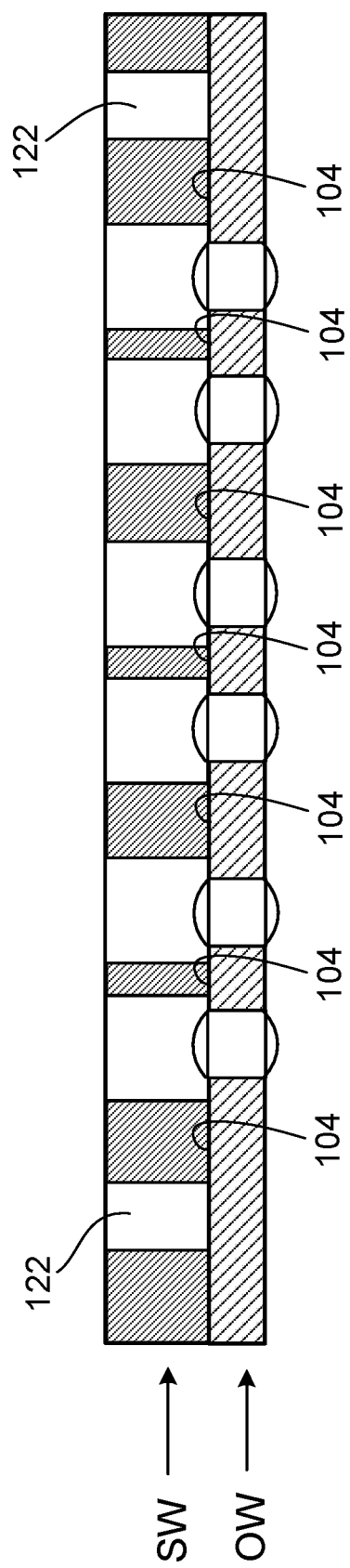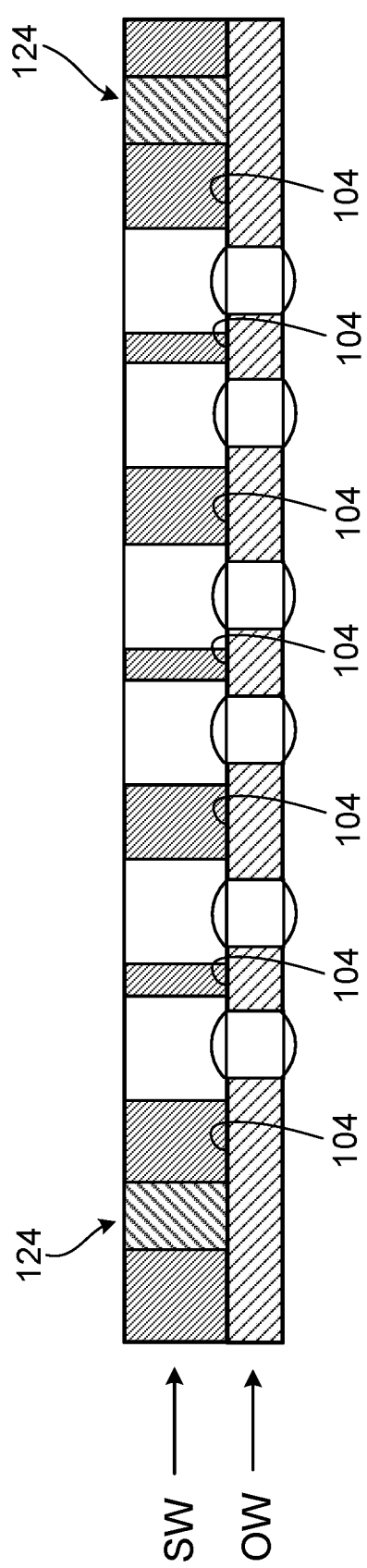

ASSEMBLY OF WAFER STACKS

CROSS-REFERENCE TO RELATED APPLICATION(S)

This application is a continuation of U.S. application Ser. No. 15/626,699, filed on Jun. 19, 2017, which is a continuation of U.S. application Ser. No. 14/401,606, filed on Nov. 17, 2014, which is the U.S. National Stage of International Application No. PCT/SG2013/000194, filed on May 15, 2013, which claims the benefit of priority U.S. Application No. 61/648,178, filed on May 17, 2012. The disclosure of the prior applications is incorporated herein by reference in their entirety.

FIELD OF THE DISCLOSURE

This disclosure relates to the manufacture and assembly of wafer stacks, such as those used, for example, to fabricate opto-electronic modules.

BACKGROUND

Optical devices such as cameras and integrated camera optics are sometimes integrated into electronic devices such as mobile phones and computers, among others. Manufacturing active and passive optical and electronic components for such devices on a wafer scale is becoming more attractive. One reason is the ongoing trend to reduce the cost of such devices.

Thus, in some applications, the various components are fabricated and assembled on a wafer scale. A wafer scale package, or wafer stack, can include multiple wafers stacked along the smallest wafer dimension (i.e., the axial direction) and attached to one another. The wafer stack can include substantially identical optical or opto-electronic devices arranged side-by-side. In such a wafer-scale assembly process, various individual components may need to be aligned with one another, and any required alignment may need to be maintained during the assembly process so that the resulting devices operate properly.

SUMMARY

Techniques are described for forming a stack of wafers in which wafers are attached to one another using a UV-cured material as well as a thermally-cured material. The details of one or more implementations are set forth in the accompanying drawings and the description below.

In one aspect, this disclosure describes a method of forming a stack of wafers. The method includes providing a sub-stack comprising a first wafer and a second wafer, each of which has a respective upper surface and lower surface. The sub-stack includes a first thermally-curable adhesive at an interface between the upper surface of the first wafer and the lower surface of the second wafer. The method includes placing a third wafer on the upper surface of the second wafer, the third wafer having an upper surface and a lower surface. A second thermally-curable adhesive is present at an interface between the upper surface of the second wafer and the lower surface of the third wafer. The method further includes providing ultra-violet (UV) radiation in a direction of the upper surface of the third wafer to cure a UV-curable adhesive in openings in the second wafer and in contact with portions of the third wafer so as to bond the third wafer to the sub-stack at discrete locations. Subsequently, the third wafer and the sub-stack are heated so to cure the first and second thermally-curable adhesives.

According to another aspect, a wafer stack includes a first, second and third wafers, each of which has a respective upper surface and lower surface. A first thermally-cured adhesive is at an interface between the upper surface of the first wafer and the lower surface of the second wafer, and a second thermally-cured adhesive is at an interface between the upper surface of the second wafer and the lower surface of the third wafer. UV-cured adhesive is disposed in the second wafer at discrete locations near the second wafer's periphery and is in contact with portions of the second and third wafers.

In some implementations, pre-curing the UV-curable adhesive material at selected locations distributed over the surface of the wafers prior to removing the wafer stack from one location (e.g., a mask aligner) can reduce the likelihood that misalignment between the wafers will occur, for example, when the stack subsequently is transferred to a second location (e.g., an oven) for thermal curing. The disclosed techniques for forming a wafer stack can, in some implementations, be faster, more accurate and less expensive than forming the wafer stack using a bond aligner.

The disclosure also describes wafer-level methods of fabricating opto-electronic modules.

Other aspects, features, and advantages will be apparent from the description and drawings, and from the claims.

BRIEF DESCRIPTION OF DRAWINGS

FIG. 1 is a cross-sectional view of wafers for forming a wafer stack for manufacturing multiple modules.

FIG. 2 is a cross-sectional view of a wafer stack for manufacturing multiple modules.

FIGS. 15, 16, 17 and 18 are cross-sectional views illustrating steps of forming another wafer stack using a local UV curing technique.

DETAILED DESCRIPTION

Figure 3:
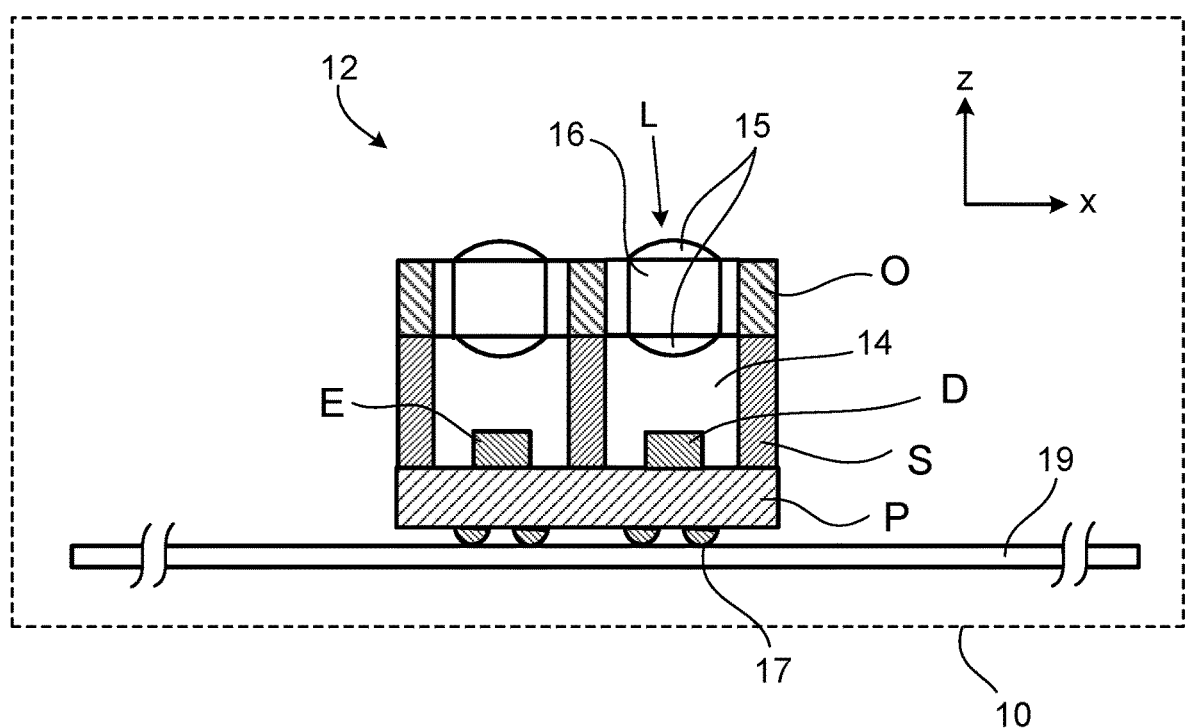
FIG. 3 is a cross-sectional view of an opto-electronic module.

FIG. 1 shows a schematic cross-sectional view of wafers for forming a wafer stack 10, as shown in FIG. 2. The stacked wafer subsequently can be divided into individual micro-optics structures. For example, as indicated by the vertical dashed lines in FIG. 2, after forming the wafer stack 10, the stack can be diced into multiple modules 12, an example of which is illustrated in FIG. 3. In the following paragraphs, further details of the illustrated module 12 are described. However, the techniques for forming a wafer stack as described in this disclosure can be used to form wafer stacks for other types of modules as well.

As illustrated in the example of FIG. 3, the module 12 includes at least one active optical component and at least one passive optical component. Examples of an active optical component include a light sensing or a light emitting component, such as a photodiode, an image sensor, an LED, an OLED or a laser chip. Examples of a passive optical component include an optical component that redirects light by refraction and/or diffraction and/or reflection such as a lens, a prism, a mirror or an optical system (e.g., a collection of passive optical components that may include mechanical elements such as aperture stops, image screens or holders).

Module 12 includes several constituents (P, S, O) stacked upon each other in the vertical direction (i.e., the z direction in FIG. 3). Directions in the x-y plane (cf., FIG. 2) that are perpendicular to the vertical (z) direction may be referred to as lateral directions. Module 12 includes a substrate P, a separation member S, and an optics member O stacked upon each other. Some implementations also may include a baffle member over the optics member. Substrate P is, for example, a printed circuit board assembly. The printed circuit board (PCB) of the PCB assembly may be referred to as an interposer. On the PCB are mounted an emission member E for emitting light (e.g., an optical transmitter die including, for example, a light-emitting diode for emitting infrared light or near-infrared light) and a detecting member D (e.g., an optical receiver die including, for example, a photo diode for detecting infrared light or near-infrared light) for detecting light at the frequency/wavelength (or range of frequencies/wavelengths) emitted by the emission member E. In general, light refers to electromagnetic radiation and, can include, for example, electromagnetic radiation in the infrared, visible or ultraviolet (UV) portion of the electromagnetic spectrum.

Electrical contacts of emission member E and detecting member D are connected electrically to outside the module 12 where solder balls 17 are attached. Some implementations include four electrical contacts: two for the emission member E and two for the detecting member D. Instead of providing solder balls 17, some implementations include contact pads on the PCB which may be provided with solder balls at a later time. Module 12 thus can be mounted, for example, on a printed circuit board 19, e.g., using surface mount technology (SMT), next to other electronic components. Printed circuit board 19 may be a constituent of an electronic device such as a hand-held communication or other computing device (e.g., a smart phone or other mobile phone).

Separation member S has two openings 14, with emission member E arranged in one of them and detecting member D being arranged in the other. This way, emission member E and detecting member D are laterally encircled by separating member S. Although the openings are shown as substantially circular, they may have other shapes in some implementations.

Separation member S may fulfill several tasks. It can ensure a well-defined distance between substrate P and optics member O (through its vertical extension) which helps to achieve well-defined light paths from emitting member E through optics member O and from the outside of module 12 through optics member O onto detecting member D. Separation member S can also provide protection of detecting member D from light that is not supposed to be detected by detection member D, by being substantially non-transparent to light generally detectable by detecting member D and by forming a portion of the outside walls of module 12. Separation member S also can provide protection of detecting member D from light emitted by emitting member E which should not reach detecting member D, so as to reduce optical cross-talk between emission member E and detecting member D, by being substantially non-transparent to light generally detectable by detecting member D and by forming a wall between emission member E and detecting member D. Light reflected inside module 12 and stray light originating from emission member E can be prevented from reaching detecting member D this way. In some implementations, separating member S is made of a polymer material, for example, a hardenable (e.g., curable) polymer material, such as an epoxy resin. The separating member can be made, for example, of an epoxy containing carbon black or other pigment.

To achieve maximum sensitivity and detection range, a close distance between emission member (e.g., LED) E and detecting member (e.g., photodiode) D can be important. However, in order to avoid erroneous sensor response and a reduced dynamic range due to internal crosstalk, the emitter situated close to the receiver requires an IR-effective optical insulation by a separating wall or cover. In the illustrated example, the separating member S has a vertical wall dividing portion that separates the emission member E and detecting member D from one another, which can help reduce internal optical crosstalk.

The active electronic components (such as emission member E and detecting member D in the example of FIG. 1) in module 12 can be packaged or unpackaged electronic components. For contacting substrate P, technologies such as wire-bonding or flip chip technology or any other known surface mount technologies may be used, as can conventional through-hole technology.

Optics member O includes a blocking portion b and two transparent portions t, one for allowing light emitted by emission member E to leave module 12, and another one for allowing light to enter module 12 from the outside of module 12 and reach detecting member D. Blocking portion b is substantially non-transparent for light generally detectable by detecting member D, e.g., by being made of a suitable (polymer) material. Transparent portions t comprise a passive optical component L or, more particularly and as an example, a lens member L each, for light guidance. Lens members L may, e.g., comprise, as shown in FIG. 3, two lens elements 15 in close contact to a transparent element 16. Transparent elements 16 can have the same vertical dimension as optics member O where it forms blocking portion b, such that optics member O where it forms blocking portion b together with transparent elements 16 describes a (close-to-perfect) solid plate shape. Lens elements 15 (see FIG. 1) redirect light by refraction and/or by diffraction. For example, the lens elements may all be of generally convex shape (as shown in FIG. 1), but one or more of lens elements 15 may be differently shaped, e.g., generally or partially concave.

In some implementations, the module 12 can be used as a proximity sensor. Proximity sensor modules can be incorporated, for example, into a mobile phone to detect that the mobile phone is next to the user's ear or face so that the phone's display can be dimmed or deactivated automatically when the display is not being used, thereby extending the life of the phone's battery.

Returning to FIGS. 1 and 2, the stack 10 includes first, second and third wafers PW, SW, OW. In the illustrated example, the first wafer PW is a substrate wafer, the second wafer SW is a spacer wafer, and the third wafer OW is an optics wafer. In other implementations, the wafer stack 10 may include as few as two wafers or may include more than three wafers. Also, the wafers may be of different types than those in the illustrated example.

Generally, a wafer refers to a substantially disk- or plate-like shaped item, its extension in one direction (z-direction or vertical direction) is small with respect to its extension in the other two directions (x- and y-directions or lateral directions). On a (non-blank) wafer, a plurality of similar structures or items can be arranged, or provided therein, for example, on a rectangular grid. A wafer can have openings or holes, and in some cases a wafer may be free of material in a predominant portion of its lateral area. Depending on the implementation, a wafer may be made, for example, of a semiconductor material, a polymer material, a composite material comprising metals and polymers or polymers and glass materials. The wafers may comprise hardenable materials such as a thermally or ultraviolet (UV) curable polymers. In some implementations, the diameter of a wafer is between 5 cm and 40 cm, and can be, for example between 10 cm and 31 cm. The wafer may be cylindrical with a diameter, for example, of 2, 4, 6, 8 or 12 inches, one inch being about 2.54 cm. The wafer thickness can be, for example, between 0.2 mm and 10 mm, and in some cases, is between 0.4 mm and 6 mm.

Although the wafer stack 10 of FIGS. 1 and 2 show provisions for three modules 12, in some implementations there can be, in one wafer stack, provisions for at least ten modules in each lateral direction, and in some cases at least thirty or even fifty or more modules in each lateral direction. Examples of the dimensions of each of the wafers are: laterally at least 5 cm or 10 cm, and up to 30 cm or 40 cm or even 50 cm; and vertically (measured with no components arranged on substrate wafer PW) at least 0.2 mm or 0.4 mm or even 1 mm, and up to 6 mm or 10 mm or even 20 mm.

In the illustrated example of FIGS. 1 and 2, each wafer PW, SW, OW comprises multiple substantially identical members across its surface(s). For example, optics wafer OW can include lens elements 15 and lens members L, which can be arranged, for example, on a rectangular lattice, with a little distance from each other to facilitate a subsequent separation step. Furthermore, such members can be formed, for example, using a replication process.

Substrate wafer PW can be, for example, a PCB assembly comprising a PCB of standard PCB materials, provided with solder balls 17 on the one side and with active optical components (e.g., members E and D described above) soldered to the other side. The latter can be placed on substrate wafer PW, for example, by pick-and-place using standard pick-and-place machines.

The spacer wafer SW can help maintain the substrate wafer PW and the optics wafer OW at substantially a constant distance from one another. Thus, incorporating the spacer wafer SW into the wafer stack can enable higher imaging performance and complexity.

In order to provide maximum protection from detecting undesired light, each of the wafers PW, SW, OW preferably is composed of a material that is substantially non-transparent for light detectable by detecting members D, except for areas specifically designed to be transparent (e.g., transparent portions t and transparent regions 3). Nevertheless, the techniques described in this disclosure can be used with transparent wafers as well.

To form the wafer stack 10, the wafers PW, SW and OW are aligned and bonded together. Each active optical component (such as detecting members D and emission members E on the substrate wafer PW) should be accurately aligned with a corresponding passive optical component (such as lens members L of the optics wafer OW). In some implementations, a hole may be formed in the substrate wafer PW, where the hole extends through a thickness of the substrate wafer PW, to provide venting during the reflow process in order to release pressure build-up. The hole can be formed in the substrate wafer PW through drilling or an etching process. The following paragraphs describe further details of an alignment and bonding process that can be used to form the wafer stack 10.

Figure 4:
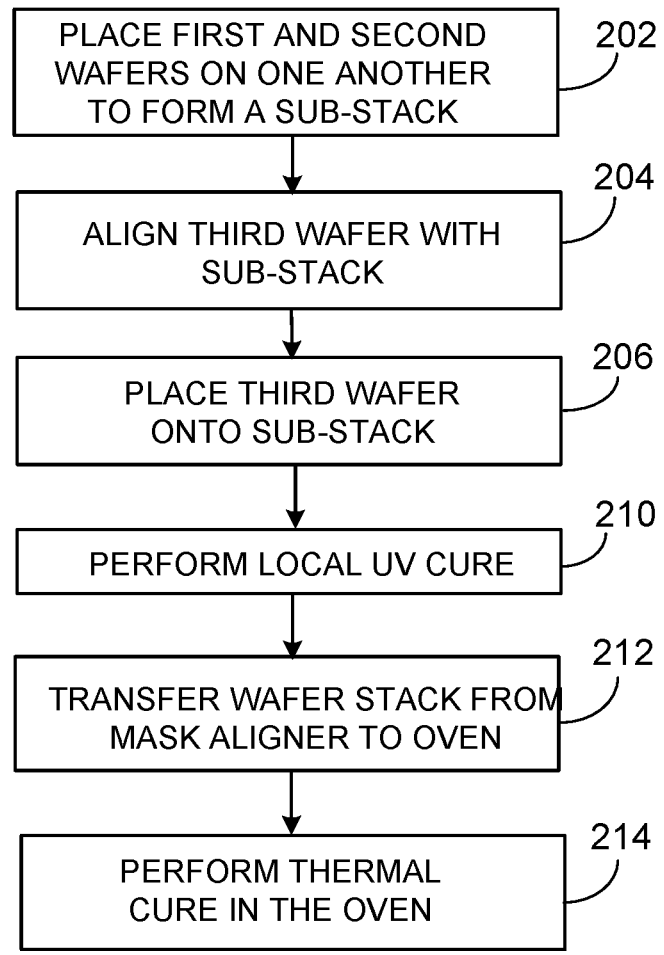
FIG. 4 is a flow chart of a method of fabricating a wafer stack.
Figure 5:
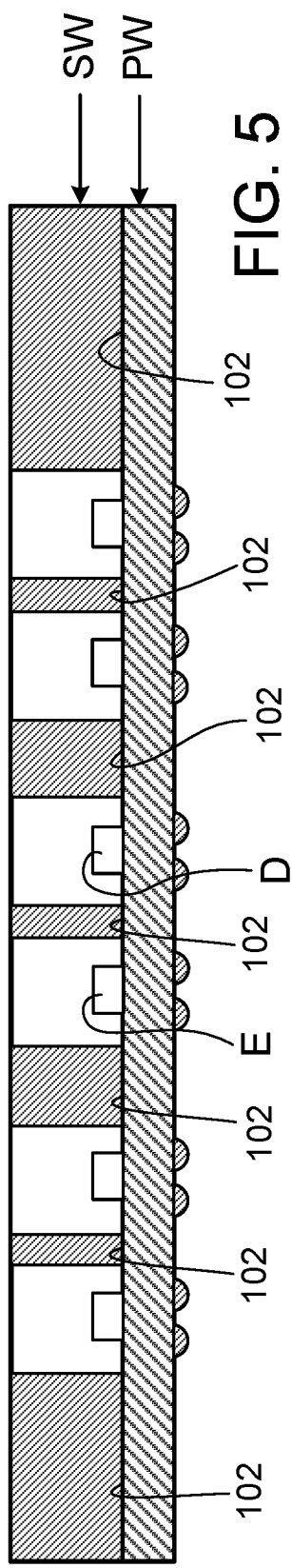
FIG. 5 illustrates a pair of wafers on one another, with a thermally-curing adhesive at the contact interfaces.

Initially, two of the wafers that are to form the wafer stack 10 are placed one on the other to form a sub-stack (FIG. 4, block 202). For example, in one implementation, the spacer wafer SW is placed on the substrate wafer PW such that the active optical components (e.g., members E and D) on the substrate wafer PW are located within the openings 14 in the spacer wafer SW. As illustrated in FIG. 5, a thermally curable adhesive 102 is present on one or both of the contacting surfaces at the interface between the spacer wafer SW and the substrate wafer PW.

In the illustrated example, the thermally curable adhesive 102 is provided as a thin layer that substantially covers the lower side of the spacer wafer SW. In some implementations, however, the adhesive 102 may be provided as droplets adhering to the lower surface of the spacer wafer SW and/or the upper surface of the substrate wafer PW.

The adhesive material 102 can be applied, for example, by a jet printing or jet spraying process in which droplets are applied by a jet head that scans over the surface and ejects the droplets at places where the adhesive is to be applied. The collection of droplets does not need to cover an entire surface portion of the spacer wafer SW or substrate wafer PW, but may comprise discrete droplets that flow into each other because of capillary forces when the spacer wafer SW and substrate wafer PW are brought together. In some implementations, the adhesive material 102 can be applied by a screen printing-like process, by a lithographic process, by another printing process or by other means (e.g., by a squeegee).

To form the stack 10, a third wafer (e.g., optical wafer OW) is aligned with the sub-stack (block 204) and is placed on the sub-stack (block 206) such that its lower surface is on the upper surface of the spacer wafer SW. Here too, a thermally curable adhesive 104 is disposed on one or both of the contacting surfaces at the interface between the spacer wafer SW and the optics wafer OW (see FIG. 6).

In some implementations, aligning the third wafer (e.g., the optics wafer OW) and the sub-stack involves aligning the optics wafer OW and the substrate wafer PW, and can be performed, for example, using a mask aligner. In some implementations, the mask aligner has multiple (e.g., four) calibrated microscopes that can be used to align alignment marks on the wafers. For example, the substrate wafer PW and the optics OW each may have multiple (e.g., two) alignment marks.

In some implementations, the first and second wafers (e.g., the substrate wafer PW and the spacer wafer SW) are placed on one another outside the mask aligner to form the sub-stack, which then is loaded into the mask aligner where it is held, for example, on a first chuck. The third wafer (e.g., the optics wafer OW) then is loaded into the mask aligner where it is held by a second chuck. In such implementations, blocks 204 and 206 of FIG. 4 are performed in the mask aligner. In some cases, the mask aligner can provide alignment between the alignment marks on the wafers with accuracy on the order of 1-2 microns. In some implementations, placement of the first and second wafers (e.g., the substrate wafer PW and the spacer wafer SW) on one another (block 202 of FIG. 4) also takes place in the mask aligner.

The thermally curable adhesives 102, 104 can be provided on the surfaces of the wafers prior to loading the wafers into the mask aligner. The thermally curable adhesive 104 at the interface between the second and third wafers can be the same as or different from the thermally curable adhesive 102 at the interface between the first and second wafers. Likewise, the thermally curable adhesive 104 can be applied to the wafer surface(s) using the same technique as, or a different technique from, the technique used to apply the thermally curable adhesive 102. The adhesives 102, 104 should be selected to provide good adhesion to the surfaces of the wafers on which they are applied and preferably should be substantially non-transparent to the light detectable by the detecting member D.

Figure 6:
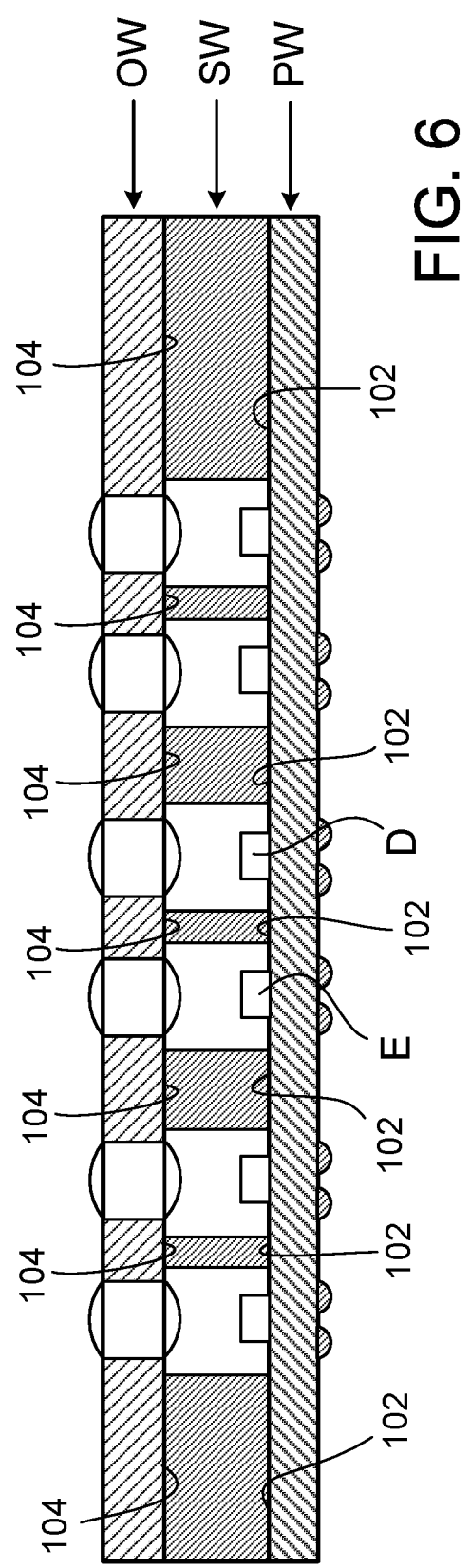
FIG. 6 illustrates three wafers on one another, with thermally-curing adhesives at the contact interfaces.

One reason for using thermally curable adhesives instead of UV-curable adhesives to bond the wafers PW, SW, OW together is that, as described above, the wafers are preferably composed primarily of materials that are substantially non-transparent to the radiation detectable by the detecting member D, which in some applications, includes UV light. Thus, in many cases, UV curing techniques cannot readily be used to bond the wafers in the stack 10 when the adhesive 102, 104 is located on the surfaces of the wafers as shown in FIGS. 5 and 6. On the other hand, as described below, to cure the adhesives 102, 104 thermally, the wafer stack 10 needs to be heated at an elevated temperature. One way of accomplishing such thermal curing is to transfer the wafer stack 10 from the mask aligner to an oven (block 212) and perform the thermal cure in the oven (block 214). However, in the absence of further precautions, transferring the stack 10 prior to curing the adhesives 102, 104 can cause the wafers to become misaligned with respect to one another. For example, the optics wafer OW may become misaligned with respect to the spacer wafer SW and/or the substrate wafer PW.

To reduce the likelihood of the wafers becoming misaligned when the stack 10 is transferred, for example, to an oven to cure the adhesives 102, 104, the optics wafer OW and spacer wafer SW initially can be bonded to one another using a local (e.g., spot) UV-curing technique at or near the peripheries of the wafers (block 210). The local UV-curing can be performed, for example, while the wafer stack 10 is in the mask aligner, prior to being transferred to the oven for the thermal cure (i.e., prior to blocks 212 and 214 of FIG. 4). As explained in greater detail below, various approaches can be used to accomplish the local UV-curing.

Figure 7:
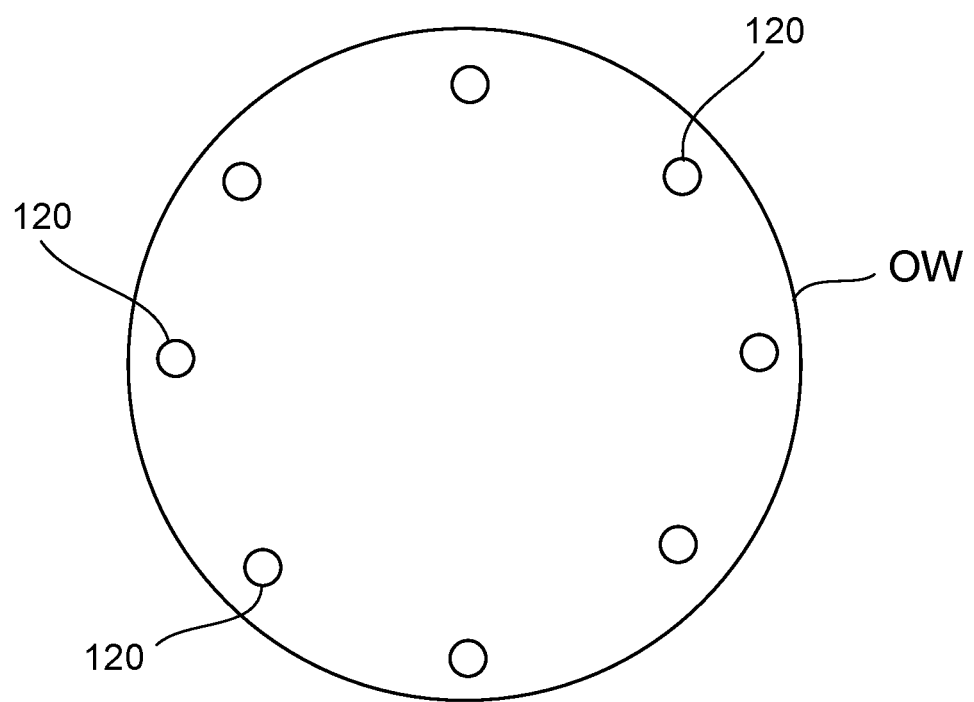
FIG. 7 illustrates a top view of a wafer indicating locations of UV-transparent windows.

To facilitate the local bonding of the optics wafer OW and spacer wafer SW, the optics wafer OW includes UV-transparent windows 120 near its periphery. In a particular implementation (see FIG. 7), the optics wafer OW has eight transparent windows 120 substantially equally spaced from another near the periphery of the wafer, with each window 120 having a diameter of between 2-4 mm (e.g., about 3 mm). Other implementations may use a different number of windows, each of which may have a shape or size different from the foregoing illustrated implementation. In some implementations, the windows 120 are through-holes extending from the front surface to the back surface of the optics wafer OW. In other implementations, the windows 120 are partially or completely filled with a UV-transparent material.

Figure 8:
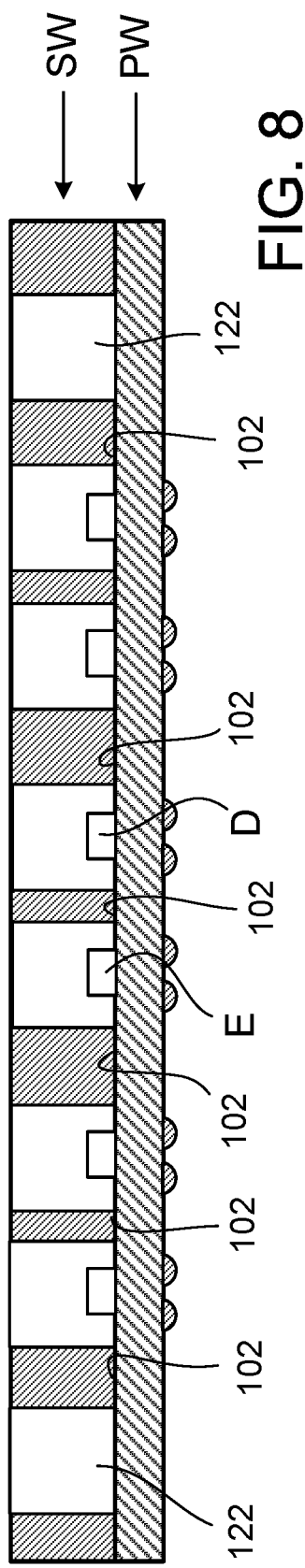
FIGS. 8, 9, 10 and 11 are cross-sectional views illustrating steps of forming a wafer stack using a first local UV curing technique.

The spacer wafer SW includes openings 122 (see FIG. 8) that correspond to the positions of the windows 120 in the optics wafer OW. The openings 122 in the spacer wafer SW can be formed, for example, as through-holes that extend from the front surface to the back surface of the spacer wafer. The openings 122 in the spacer wafer SW preferably have substantially the same diameter as the diameter of the windows 120 in the optics wafer OW.

Figure 9:
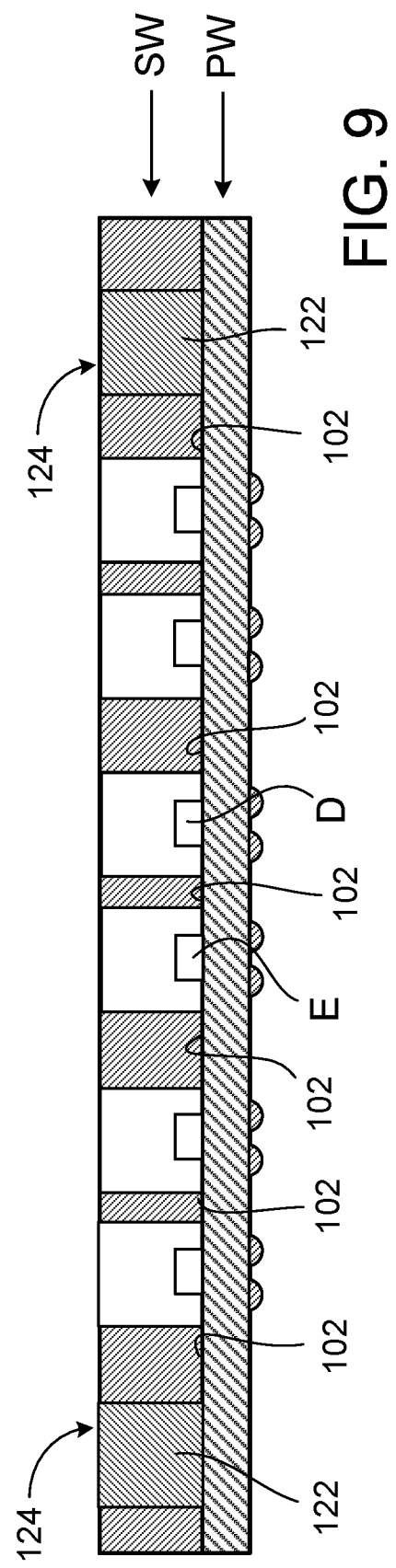
Figure 10:
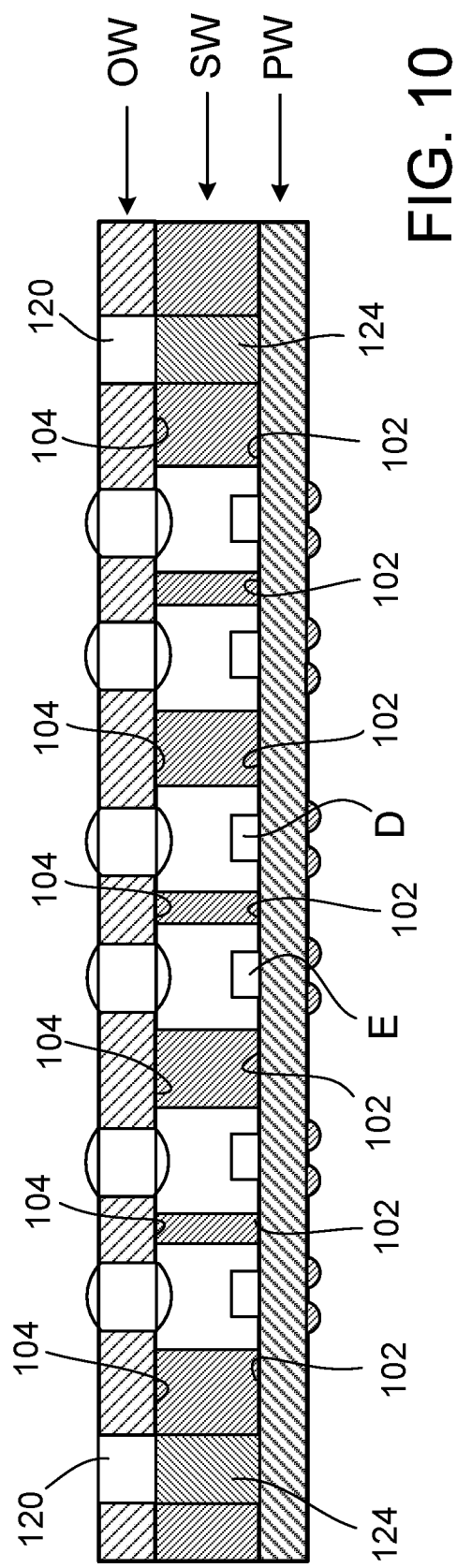
Figure 11:
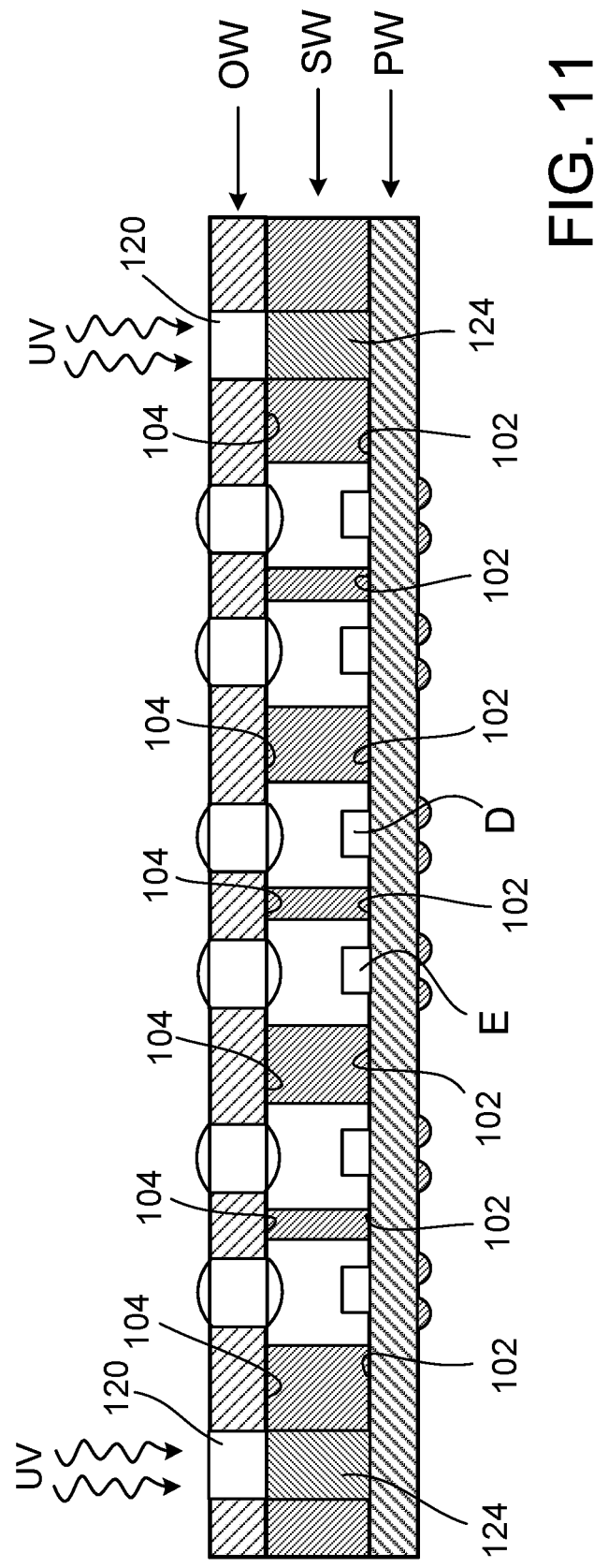

According to a first implementation, it is assumed that the optics wafer OW includes windows 120 that are partially or completely filled with a UV-transparent material. Before bringing the optics wafer OW into contact with the spacer wafer SW, the openings 122 in the spacer wafer SW are substantially filled with a UV-curable adhesive material 124, such as a UV-curable glue, epoxy or other adhesive (see FIG. 9). Next, the optical wafer OW is aligned with the substrate wafer PW (FIG. 4, block 204), and the optics wafer OW is placed on the spacer wafer SW (FIG. 4, block 206) as shown in FIG. 10. Next, as shown in FIG. 11, UV radiation (e.g., UV illumination) is directed through the windows 120 of the optics wafer OW so as to cure the adhesive material 124 and locally bond the wafers to one another (FIG. 4, block 210). The foregoing operations, including providing the UV-curable adhesive material 124, can be performed, for example, in a mask aligner. To facilitate dispensing of the UV-curable adhesive material 124 into the openings 122 in the spacer wafer SW, a vacuum chuck that holds the optics wafer OW in the mask aligner can include holes located at positions corresponding to positions of the openings 122. Following the local UV cure, the wafer stack 10 is transferred from the mask aligner to the oven (block 212) and the stack is heated so as to cure the thermally-curable adhesive materials 102, 104 simultaneously. After removal from the oven, the wafer stack 10 can be separated (e.g., diced) into separate modules 12.

Figure 12:
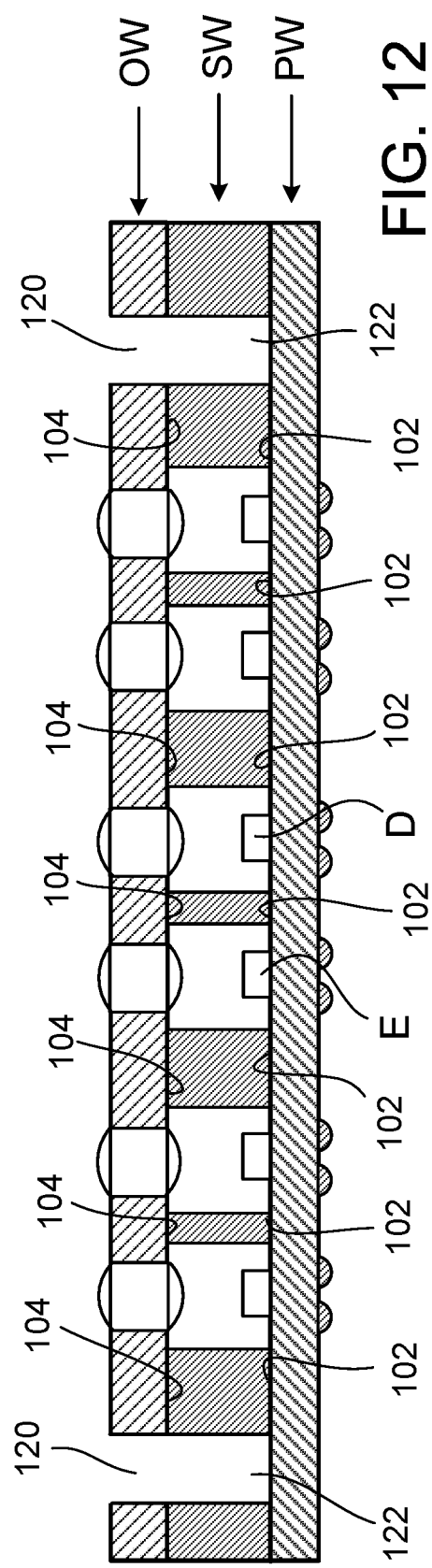
FIGS. 12, 13 and 14 are cross-sectional views illustrating steps of forming a wafer stack using a second local UV curing technique.
Figure 13:
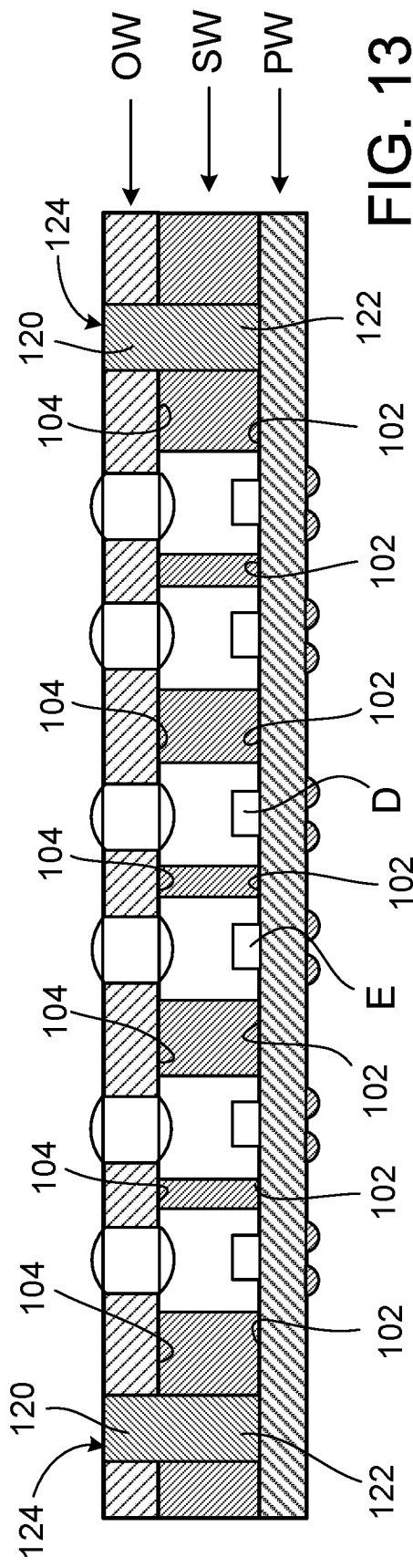
Figure 14:
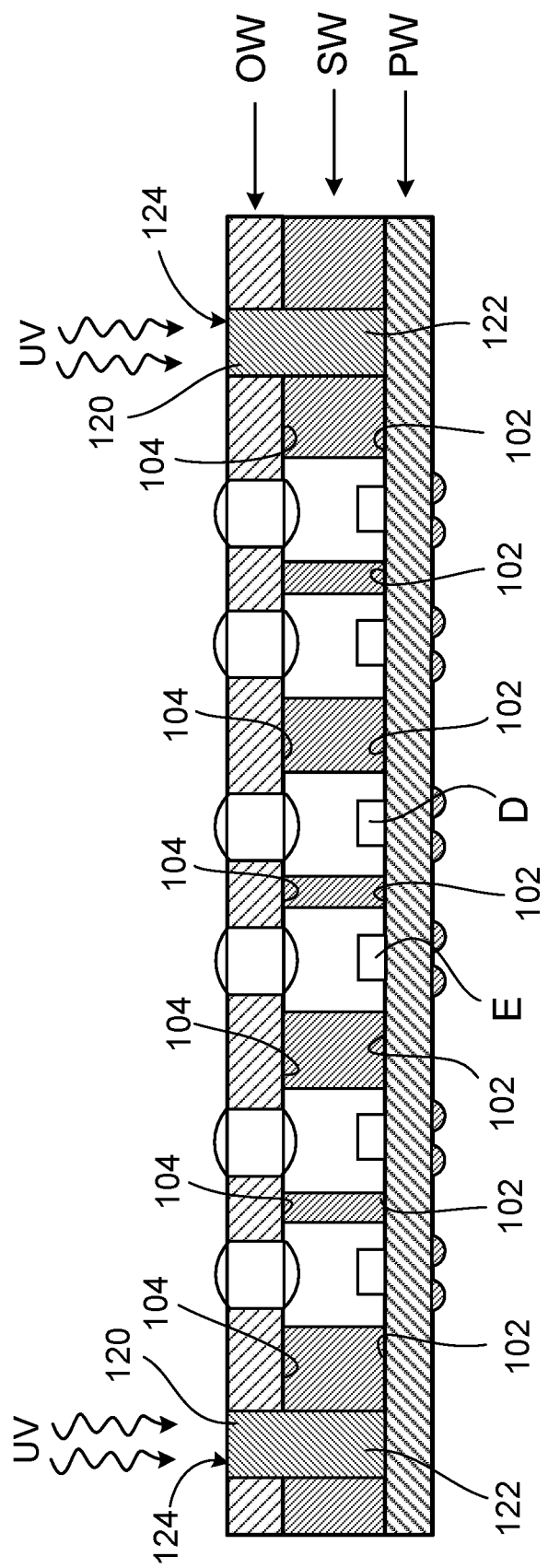

According to a second implementation, it is assumed that the windows 120 in the optics wafer OW are through-holes that extend from the front surface to the back surface of the optics wafer. In this implementation, as shown in FIG. 12, the optics wafer OW is aligned with the sub-stack and placed on the spacer wafer SW (FIG. 4, blocks 204, 206). Then, the openings 122 in the spacer wafer SW and the through-holes 120 are substantially filled with a UV-curable adhesive material 124, such as a UV-curable glue, epoxy or other adhesive (see FIG. 13). Next, as shown in FIG. 14, UV radiation is directed to the adhesive material 124 in the through-holes 120 of the optics wafer OW and the openings 122 in the spacer wafer SW so as to cure the adhesive material 124 and locally bond the wafers to one another (FIG. 4, block 210). The foregoing operations, including dispensing of the UV-curable material 124, can be performed, for example, in a mask aligner. Following the local UV cure, the wafer stack 10 is transferred from the mask aligner to the oven (block 212) and the stack is heated so as to cure the thermally-curable adhesive materials 102, 104. After removal from the oven, the wafer stack 10 can be separated (e.g., diced) into separate modules 12.

The local (e.g., spot) UV-cured bonding technique can be used to bond additional wafers to a previously-formed sub-stack of two or more wafers. For example, after adding a third wafer (e.g., the optics wafer OW) to the sub-stack of the spacer wafer SW and substrate wafer PW, a fourth wafer (e.g., a baffle wafer) can be added on top of the sub-stack comprising the optics wafer OW, the spacer wafer SW and the substrate wafer PW. The process can be repeated to add additional wafers, if needed. Furthermore, aligning and stacking the additional wafer(s), as well as dispensing the UV-curable adhesive material and performing the UV-curing process, can be accomplished in the mask aligner prior to transferring the stack to the oven for the thermal curing process. Pre-curing the adhesive material 124 at selected locations distributed over the surface of the wafers prior to removing the wafer stack from the mask aligner reduces the likelihood that misalignment between the wafers will occur, for example, when the stack subsequently is transferred to the oven for thermal curing. The disclosed techniques for forming a wafer stack can, in some implementations, be faster, more accurate and less expensive than forming the wafer stack using a bond aligner.

In the foregoing examples of forming a wafer stack, a sub-stack composed of a substrate wafer PW and a spacer wafer SW is formed, and the optics wafer OW is placed on the sub-stack. In other implementations, a sub-stack composed of an optics wafer OW and spacer wafer SW is formed, and subsequently a substrate wafer PW is placed on the sub-stack. In both cases, alignment between the sub-stack and another wafer, as well as the local UV-cure step, can take place in a mask aligner prior to moving the wafer stack to an oven for the thermal curing process. However, in the latter case, UV-transparent windows (e.g., through-holes that, in some cases, may be partially or completely filled with a UV-transparent material) are provided in the substrate wafer PW instead of in the optics wafer OW.

Figure 17:
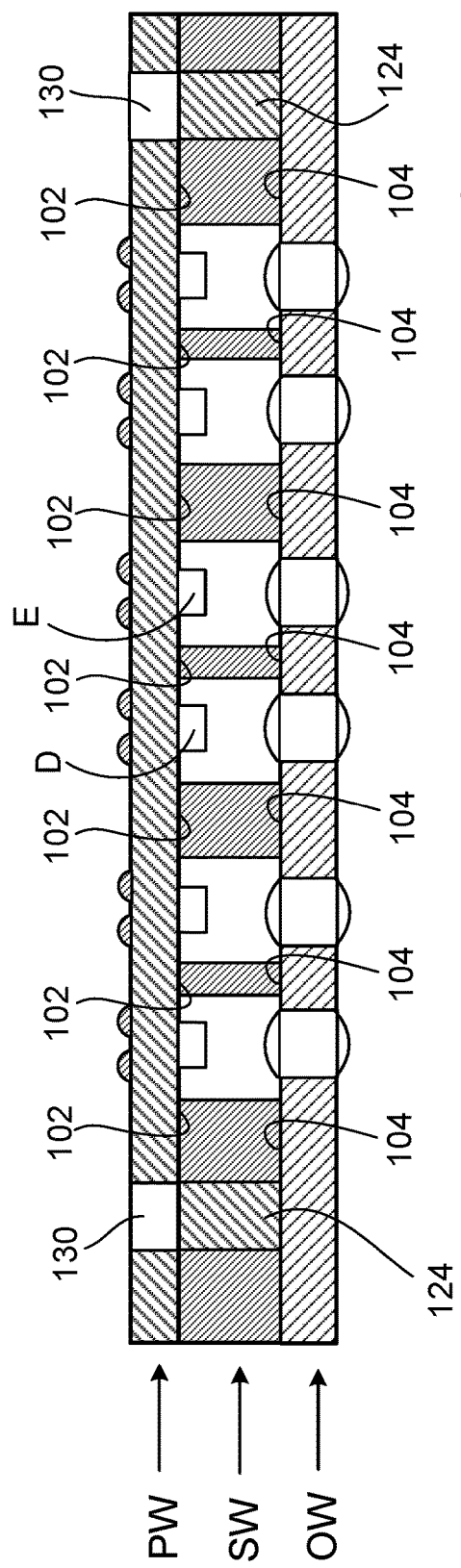
Figure 18:
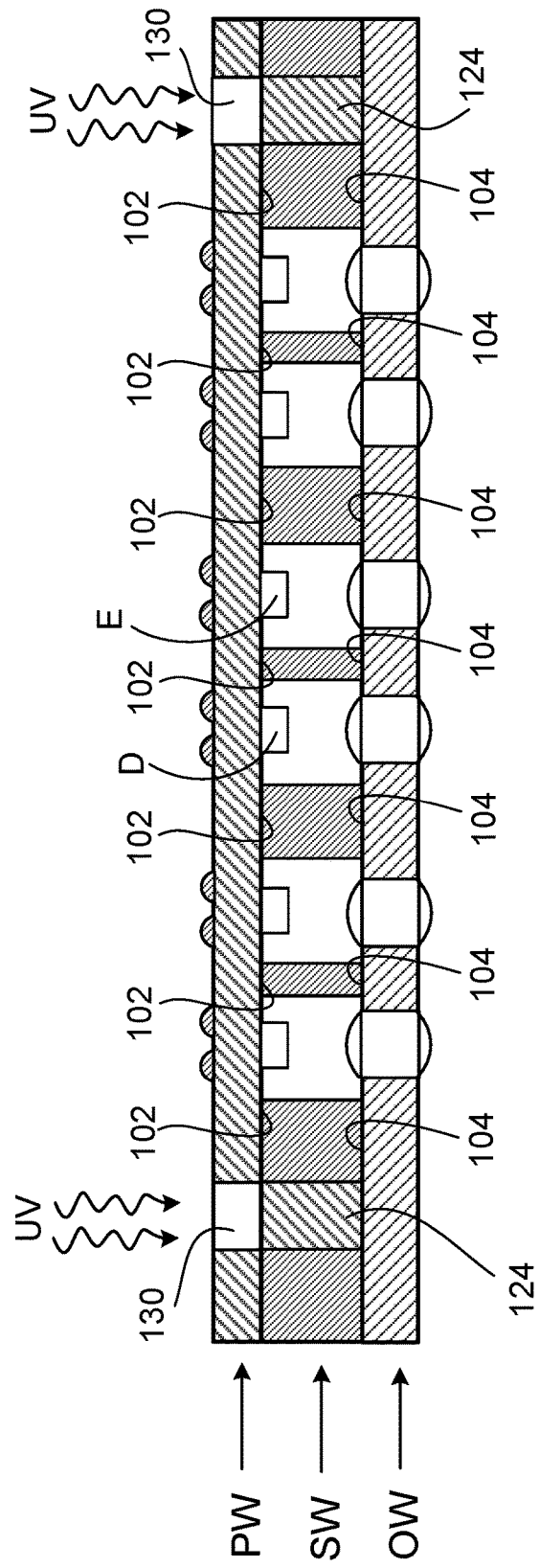

FIGS. 15-18 illustrate an example of steps in formation of a wafer stack, where a substrate wafer PW is placed onto a sub-stack composed of an optics wafer OW and spacer wafer SW. As shown in FIG. 15, the spacer wafer SW is placed on the optics wafer OW to form a sub-stack. Thermally-curing adhesive 104 is present at the contact interfaces. As described in the previous examples, the spacer wafer SW includes openings (e.g., through-holes) 122 near its periphery. Next, the openings 122 in the spacer wafer SW are substantially filled with a UV-curable adhesive material 124, such as a UV-curable glue, epoxy or other adhesive (FIG. 16). The substrate wafer PW then is aligned with the optics wafer OW, and the substrate wafer PW is placed on the spacer wafer SW as shown in FIG. 17. In this example, the substrate wafer PW includes UV-transparent windows 130 that are partially or completely filled with a UV-transparent material. Next, as shown in FIG. 18, UV radiation (e.g., UV illumination) is directed through the windows 130 of the substrate wafer PW so as to cure the adhesive material 124 and locally bond the wafers to one another. Following the local UV cure, the wafer stack 10 can be transferred to an oven so as to cure the thermally-curable adhesive materials 102, 104. After removal from the oven, the wafer stack 10 can be separated (e.g., diced) into separate modules 12.

In some implementations, the UV-transparent windows 130 near the periphery of the substrate wafer SW are through-holes that extend from one surface of the substrate wafer SW to its opposite surface. In that case, the openings 122 at the periphery of the spacer wafer SW and the corresponding windows 130 near the periphery of the substrate wafer PW can be substantially filled with the UV-curable material 124 after the substrate wafer SW is aligned and placed on the sub-stack. As in the previous example, UV radiation (e.g., UV illumination) then is directed toward the surface of the substrate wafer PW so as to cure the adhesive material 124 and locally bond the wafers to one another. Following the local UV cure, the wafer stack 10 can be transferred to an oven so as to cure the thermally-curable adhesive materials 102, 104. After removal from the oven, the wafer stack 10 can be separated (e.g., diced) into separate modules 12.

The fact that many of the alignment steps are carried out on the wafer level makes it possible to achieve good alignment (in particular of members D and E with respect to members L) in a relatively simple and fast way. The overall manufacturing process can, therefore, be very fast and precise. Due to the wafer-scale manufacturing, only a small number of production steps is required for manufacturing multiple modules 12.

A number of implementations have been described. Nevertheless, it will be understood that various modifications may be made without departing from the spirit and scope of the invention. Accordingly, other implementations are within the scope of the claims.

What is claimed is:

1. A wafer stack comprising:
   a substrate wafer having an upper surface on which are mounted a plurality of light emitting or light sensing components;
   a spacer wafer attached to the substrate wafer and having first openings such that each of the light emitting or light sensing components is laterally surrounded by the spacer wafer, the spacer wafer further having second openings; and
   an optics wafer attached to the spacer wafer, the optics wafer including a plurality of optical elements on at least one of its surfaces, the optics wafer further including solid UV-transparent windows;
   wherein each of the solid UV-transparent windows is disposed directly over the respective second opening in the spacer wafer at an interface between the spacer wafer and the optics wafer, each of the second openings being filled with UV-cured adhesive that locally bonds the spacer wafer and the optics wafer together,
   wherein each of the solid UV-transparent windows in the optics wafer is disposed adjacent a periphery of the optics wafer.

2. The wafer stack of claim 1 wherein the substrate wafer, spacer wafer, and optics wafer are made of materials substantially non-transparent to UV-radiation.

3. The wafer stack of claim 1 wherein the optics wafer is attached to the spacer wafer by thermal adhesive.

4. The wafer stack of claim 1 wherein the spacer wafer is attached to the substrate wafer by thermal adhesive.

5. The wafer stack of claim 1 wherein the solid UV-transparent windows in the optics wafer are equally spaced from one another.

6. The wafer stack of claim 1 wherein each of the solid UV-transparent windows in the optics wafer has a diameter in a range of 2-4 mm.

7. A wafer stack comprising:
   a substrate wafer having an upper surface on which are mounted a plurality of light emitting or light sensing components;
   a spacer wafer bonded to the substrate wafer and having first openings such that each of the light emitting or light sensing components is laterally surrounded by the spacer wafer, the spacer wafer further having second openings filled with UV-cured adhesive; and
   an optics wafer bonded to the spacer wafer, the optics wafer including a plurality of optical elements on at least one of its surfaces, the optics wafer having through-holes containing UV-cured adhesive, wherein each of the through-holes containing UV-cured adhesive is disposed directly over a respective one of the second openings in the spacer wafer, at an interface between the spacer wafer and the optics wafer, that is filled with UV-cured adhesive, and
   wherein the UV-cured adhesive in the through-holes and in the second openings locally bond the spacer wafer and the optics wafer together, wherein each of the through-holes containing UV-cured adhesive in the optics wafer is disposed adjacent a periphery of the optics wafer.

8. The wafer stack of claim 7 wherein the substrate wafer, spacer wafer, and optics wafer are made of materials substantially non-transparent to UV-radiation.

9. The wafer stack of claim 7 wherein the optics wafer is attached to the spacer wafer by thermal adhesive.

10. The wafer stack of claim 7 wherein the spacer wafer is attached to the substrate wafer by thermal adhesive.

11. The wafer stack of claim 7 wherein the through-holes containing UV-cured adhesive in the optics wafer are equally spaced from one another.

12. The wafer stack of claim 7 wherein each of the through-holes containing UV-cured adhesive in the optics wafer has a diameter in a range of 2-4 mm.

* * * * *